(12) United States Patent
Lin et al.

(10) Patent No.: US 12,198,581 B2
(45) Date of Patent: Jan. 14, 2025

(54) HIGHLY TRANSPARENT AND STRETCHABLE LED DISPLAY STRUCTURE

(71) Applicant: General Interface Solution Limited, Miaoli County (TW)

(72) Inventors: Po-Ching Lin, Miaoli County (TW); Po-Lun Chen, Miaoli County (TW); Chun-Ta Chen, Miaoli County (TW); Ya-Chu Hsu, Miaoli County (TW); Chia-Ming Fan, Miaoli County (TW)

(73) Assignee: General Interface Solution Limited, Miaoli County (TW)

( * ) Notice: Subject to any disclaimer, the term of this patent is extended or adjusted under 35 U.S.C. 154(b) by 276 days.

(21) Appl. No.: 18/084,708

(22) Filed: Dec. 20, 2022

(65) Prior Publication Data

US 2024/0203298 A1 Jun. 20, 2024

(30) Foreign Application Priority Data

Dec. 16, 2022 (CN) .......................... 202211622223.2

(51) Int. Cl.
*H05K 1/02* (2006.01)
*G06F 1/16* (2006.01)
(Continued)

(52) U.S. Cl.
CPC ............ *G09F 9/335* (2021.05); *G06F 1/1652* (2013.01); *G09F 9/301* (2013.01); *H10K 50/84* (2023.02)

(58) Field of Classification Search
CPC ...... H05K 1/02; H05K 1/0283; H05K 1/0313; H05K 1/118; H05K 1/147; H05K 1/189; H10K 50/81; H10K 50/82; H10K 50/84; H10K 50/86; H10K 50/856; H10K 59/00; H10K 59/12; H10K 59/18; H10K 59/35; H10K 59/87; H10K 59/121; H10K 59/122; H10K 59/124; H10K 59/127; H10K 59/129; H10K 59/131; H10K 59/873; H10K 59/1201; H10K 59/1275; H10K 71/00;
(Continued)

(56) References Cited

U.S. PATENT DOCUMENTS 6,608,620 B1 * 8/2003 Suzuki .................... G09G 3/22
 345/55
11,061,440 B1 * 7/2021 Wang .................... G06F 1/1652
(Continued)

*Primary Examiner* — Xiaoliang Chen
(74) *Attorney, Agent, or Firm* — Locke Lord LLP; Tim Tingkang Xia, Esq.

(57) ABSTRACT

A light emitting diode display device includes: a substrate, a plurality of signal lines, and a plurality of transparent apertures. A plurality of element packages arranged in matrix on one side of the substrate, the two element packages are connected by the signal lines, and the transparent aperture is surrounded by the signal lines. The signal line is a multi-layer structure for transmitting signal, which can reduce the risk of breaking the signal transmission line during stretching. The transparent aperture is stacked with organic materials, and the inorganic material is removed, which reduces the problem of the cracking and extension of the inorganic material layer when the product is stretched. It also has the effect of reducing the penetration loss caused by the refraction of light through multiple layers, so that the transparent aperture forms a high light-transmitting effect.

17 Claims, 14 Drawing Sheets

(51) Int. Cl.
  *G09F 9/30* (2006.01)
  *G09F 9/33* (2006.01)
  *H10K 50/81* (2023.01)
  *H10K 50/82* (2023.01)
  *H10K 50/84* (2023.01)
  *H10K 50/856* (2023.01)
  *H10K 50/86* (2023.01)
  *H10K 59/00* (2023.01)
  *H10K 59/12* (2023.01)
  *H10K 59/121* (2023.01)
  *H10K 59/122* (2023.01)
  *H10K 59/124* (2023.01)
  *H10K 59/127* (2023.01)
  *H10K 59/129* (2023.01)
  *H10K 59/131* (2023.01)
  *H10K 59/18* (2023.01)
  *H10K 59/35* (2023.01)
  *H10K 71/00* (2023.01)

(58) Field of Classification Search
  CPC ....... H10K 77/111; G06F 1/163; G06F 1/189;
    G06F 1/1643; G06F 1/1652; G06F
    1/1656; G06F 1/1694; G09F 9/30; G09F
    9/301; G09F 9/335
  USPC ............. 361/749; 257/40, 91; 313/310, 504;
    345/55, 75.1, 75.2, 84, 100, 204
  See application file for complete search history.

(56) References Cited

U.S. PATENT DOCUMENTS

| | | | |
|---|---|---|---|
| 2015/0219326 A1* | 8/2015 | Verheyen | F21V 23/003 362/249.02 |
| 2020/0027945 A1* | 1/2020 | Kim | H10K 50/81 |
| 2020/0028102 A1* | 1/2020 | Kim | H10K 59/131 |
| 2020/0035778 A1* | 1/2020 | Kim | H10K 50/86 |
| 2020/0037442 A1* | 1/2020 | Keum | H05K 1/147 |
| 2020/0211437 A1* | 7/2020 | Ahn | H10K 59/131 |
| 2021/0020077 A1* | 1/2021 | Huang | H01L 25/0753 |
| 2021/0027671 A1* | 1/2021 | Lee | H10K 59/131 |
| 2021/0056873 A1* | 2/2021 | Jung | H10K 59/122 |
| 2021/0126172 A1* | 4/2021 | Eom | H01L 33/62 |
| 2021/0166590 A1* | 6/2021 | Jung | G09F 9/301 |
| 2021/0175448 A1* | 6/2021 | Ban | H10K 77/111 |
| 2022/0075419 A1* | 3/2022 | Nomoto | G09F 9/30 |
| 2022/0122948 A1* | 4/2022 | Kim | H01L 25/0753 |
| 2022/0199596 A1* | 6/2022 | Chen | H10K 71/00 |
| 2022/0328604 A1* | 10/2022 | Yang | G09F 9/301 |
| 2023/0105157 A1* | 4/2023 | Jiang | H10K 59/121 257/40 |
| 2023/0157101 A1* | 5/2023 | Yu | H10K 59/131 257/40 |
| 2023/0363202 A1* | 11/2023 | Xue | H10K 59/87 |

* cited by examiner

HIGHLY TRANSPARENT AND STRETCHABLE LED DISPLAY STRUCTURE

REFERENCE TO RELATED APPLICATIONS

The present application is based on, and claims priority from, China Application Serial Number 202211622223.2 filed Dec. 16, 2022, the disclosure of which is hereby incorporated by reference herein in its entirety.

BACKGROUND OF THE INVENTION

Field of the Invention

The invention relates to a light emitting diode display device, in particular to a stretch-resistant light emitting diode display device with a stretchable and deflectable sensing device.

Description of the Related Art

Light emitting diodes (LEDs, especially Micro LEDs) are regarded as a new generation of display technology, the overlord of the next generation of display technology. Many manufacturers have invested in the R&D and production of this product, and its market prospect is very promising. High brightness, low power consumption, ultra-high resolution and color saturation etc. are all product advantages of LEDs, and the biggest advantages all come from its maximum characteristic micron-level spacing, for every pixel of the display can address control and single-point drive light.

LEDs use inorganic materials, which have the advantages of long service life and simple structure for applications in flexible displays. However, in the actual process or application, the device interface may be split due to stress. In the conformal process, since the stress on the LED is not in a single direction, the LED may be split due to the inability to withstand the stress during the manufacturing process. Please refer to FIG. 14, which is a schematic diagram of the LEDs in the prior art deviated from the neutral plane on the substrate. When the conformal display (or flexible display) is actually used in the behavior of bending, since the LED 8 is stacked the form of the structure is set on the substrate 82 of the flexible display, so the LED 8 is easy to deviate from the neutral plane of the substrate 82, causing damage to the LED.

According to the above, how to reduce the stress on LEDs in all directions by conformal displays (or flexible displays), avoid splitting, and reduce the chance of component damage when flexing occurs unresolved issues.

BRIEF SUMMARY OF THE INVENTION

The object of the present invention is to provide a light emitting diode display device, which connects the elements between the thin film transistor and the light emitting diode with a multi-layer stretchable metal signal transmission line to reduce stress and reduce element damage.

The object of the present invention is to provide a light emitting diode display device, which is stacked with organic materials by stacking transparent apertures, and because of the removal of inorganic materials, the penetration loss caused by light passing through multiple layers of refraction is reduced, so that transparent apertures form high light transmission and stretchable.

The object of the present invention is to provide a light emitting diode display device, which can greatly reduce the problem of disconnection of display elements by stacking organic materials in the transparent apertures and removing components for display or telecommunication transmission, so as to improve product stretching use.

The object of the present invention is to provide a light emitting diode display device, the pixel element packaging area has the largest Young's modulus, the stretched signal line area is the second, and the transparent aperture is the smallest, so that the transparent aperture is the main stretched area during the stretching process.

In an embodiment, a light emitting diode display device comprises: a substrate, a plurality of first stretched signal line areas, a plurality of second stretched signal line areas, a plurality of first transparent apertures and a plurality of second transparent apertures. The substrate has a plurality of pixel element packaging areas arranged in matrix, each pixel element packaging area is a rectangle, and has at least one light emitting unit. The plurality of first stretched signal line areas are arranged in matrix, each first stretched signal line area is connected to two short sides of the pixel element packaging area, and has a first curve. The plurality of second stretched signal line areas are arranged in matrix, each second stretched signal line area is connected to two long sides of the pixel element packaging area, and has a second curve. The plurality of first transparent apertures are arranged in matrix, each first transparent aperture is surrounded by the first stretched signal line area, and has an aperture ratio. The plurality of second transparent apertures are arranged in matrix, each second transparent aperture is surrounded by the second stretched signal line area, and has the aperture ratio.

In an embodiment, the first transparent aperture and the second transparent are stacked with organic materials on the substrate, and the inorganic material is removed. The substrate is stacked with a support substrate and a flexible substrate.

In an embodiment, the flexible substrate further has a plurality of openings on the support substrate.

In an embodiment, the flexible substrate further has a packaging layer.

In an embodiment, the packaging layer and the flexible substrate further have a plurality of through holes on the support substrate.

In an embodiment, the pixel element packaging area has a first Young's modulus, the first stretched signal line area and the second stretched signal line area have the same second Young's modulus, and the first transparent aperture and the second transparent aperture have the same third Young's modulus, the first Young's modulus is more than the second Young's modulus, and the second Young's modulus is more than the third Young's modulus.

In an embodiment, the first stretched signal line area and the second stretched signal line area are made of at least one metal material, and the metal materials are connected by via.

In an embodiment, the first curve and the second curve are elliptical.

In an embodiment, the substrate is defined a first direction as extending along the long side of the pixel element packaging area, and defined a second direction as extending along the short side of the pixel element packaging area, two centers of the pixel element packaging area are separated by a first distance along the first direction, are separated by a second distance along the second direction, and defined a curvature design value $r=(X1*X2*Y\%/\pi)^{0.5}$, where X1 is the first distance, X2 is the second distance, Y % is the aperture ratio, and $\pi$ is the circumference ratio.

In an embodiment, the first stretched signal line area has two first arc curves and two second arc curves, and the second arc curve is near to the short side of the pixel element packaging area, the second stretched signal line area has two third arc curves and two fourth arc curves, the third arc curve is near to the long side of the pixel element packaging area, a radius of curvature of the first arc curve, the second arc curve, the third arc curve and the fourth arc curve are all between 0.5 times the curvature design value and 5 times the curvature design value.

These, as well as other components, steps, features, benefits, and advantages of the present application, will now made clear by reference to the following detailed description of the embodiments, the accompanying drawings, and the claims.

BRIEF DESCRIPTION OF THE DRAWINGS

The accompanying drawings, which are incorporated herein and form a part of the Detailed Description of the Invention, illustrate various embodiments of the present invention and, together with the Detailed Description of the Invention, serve to explain principles discussed below. The drawings referred to in this Brief Description of Drawings should not be understood as being drawn to scale unless specifically noted.

DETAILED DESCRIPTION OF THE INVENTION

Figure 1:
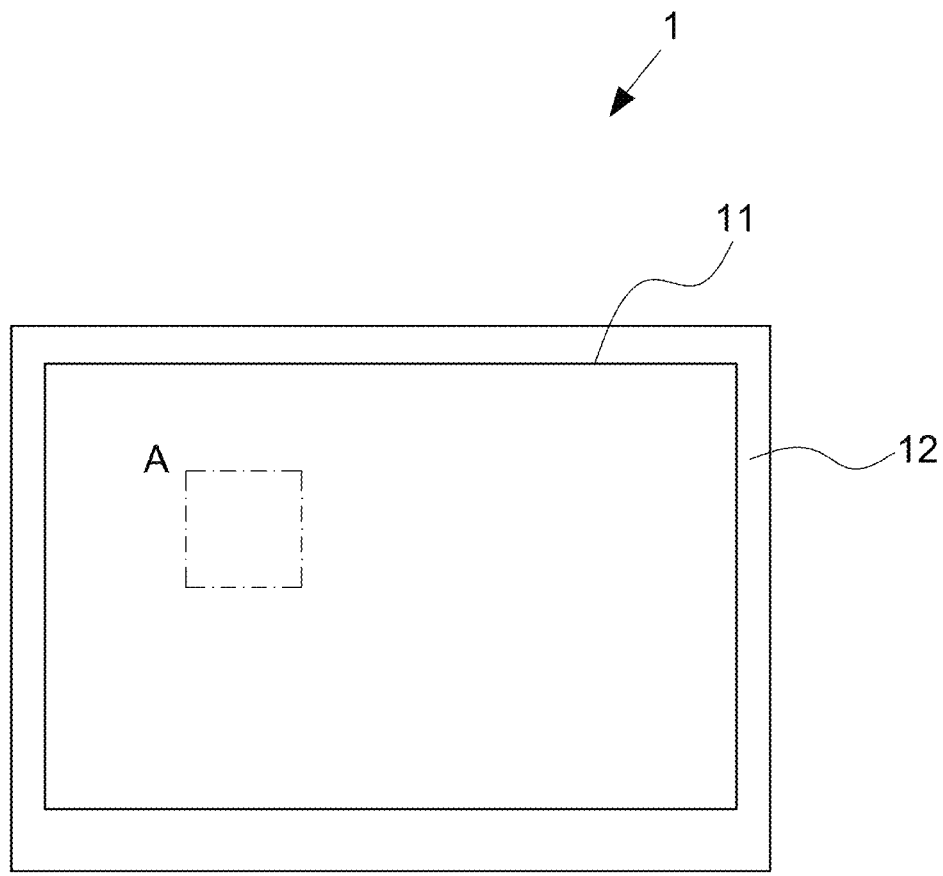
FIG. 1 is a schematic diagram of the front structure of the complete panel display device of the present invention.
Figure 2:
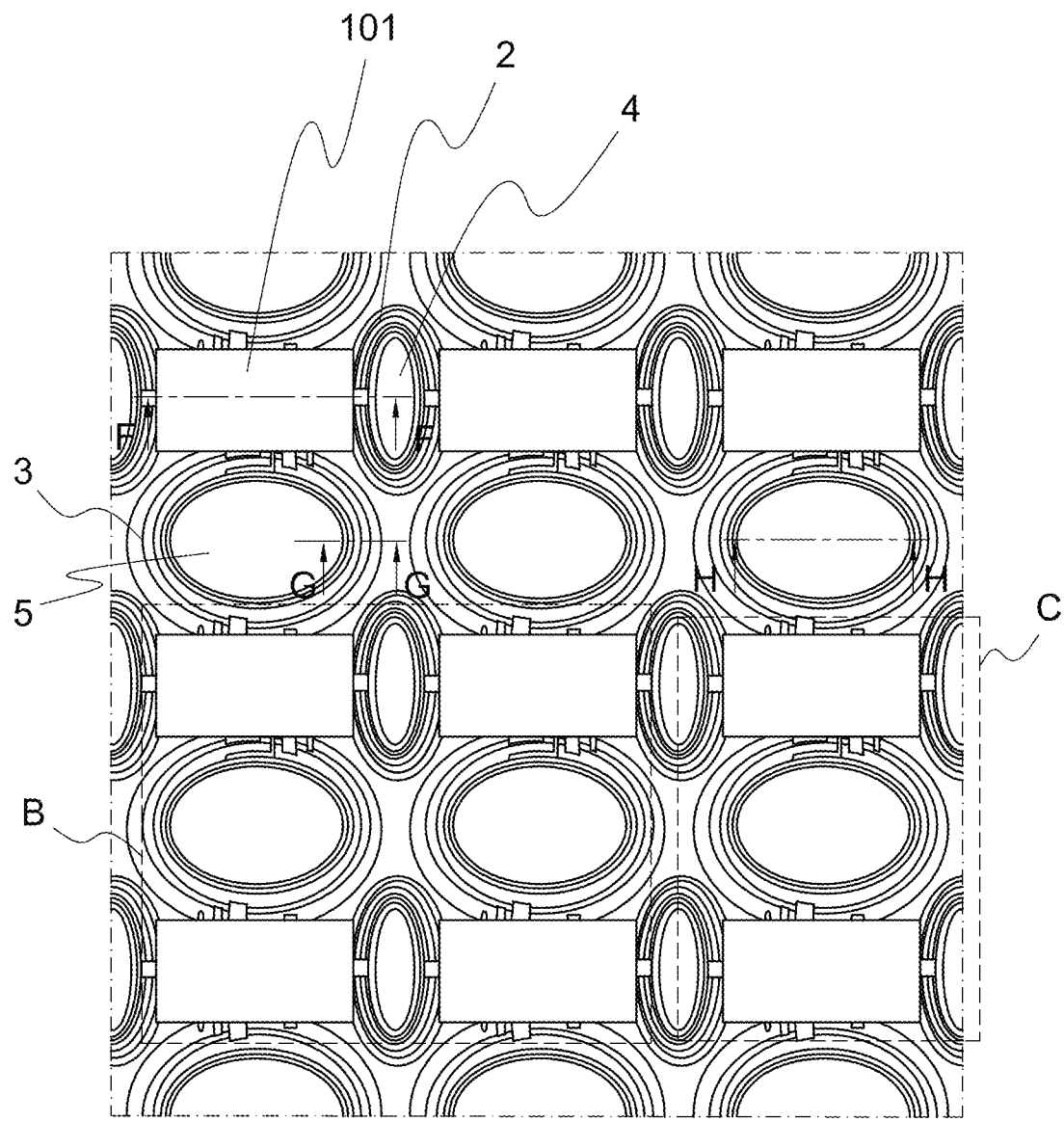
FIG. 2 is a partially enlarged schematic diagram of part A in FIG. 1 of the present invention.
Figure 3:
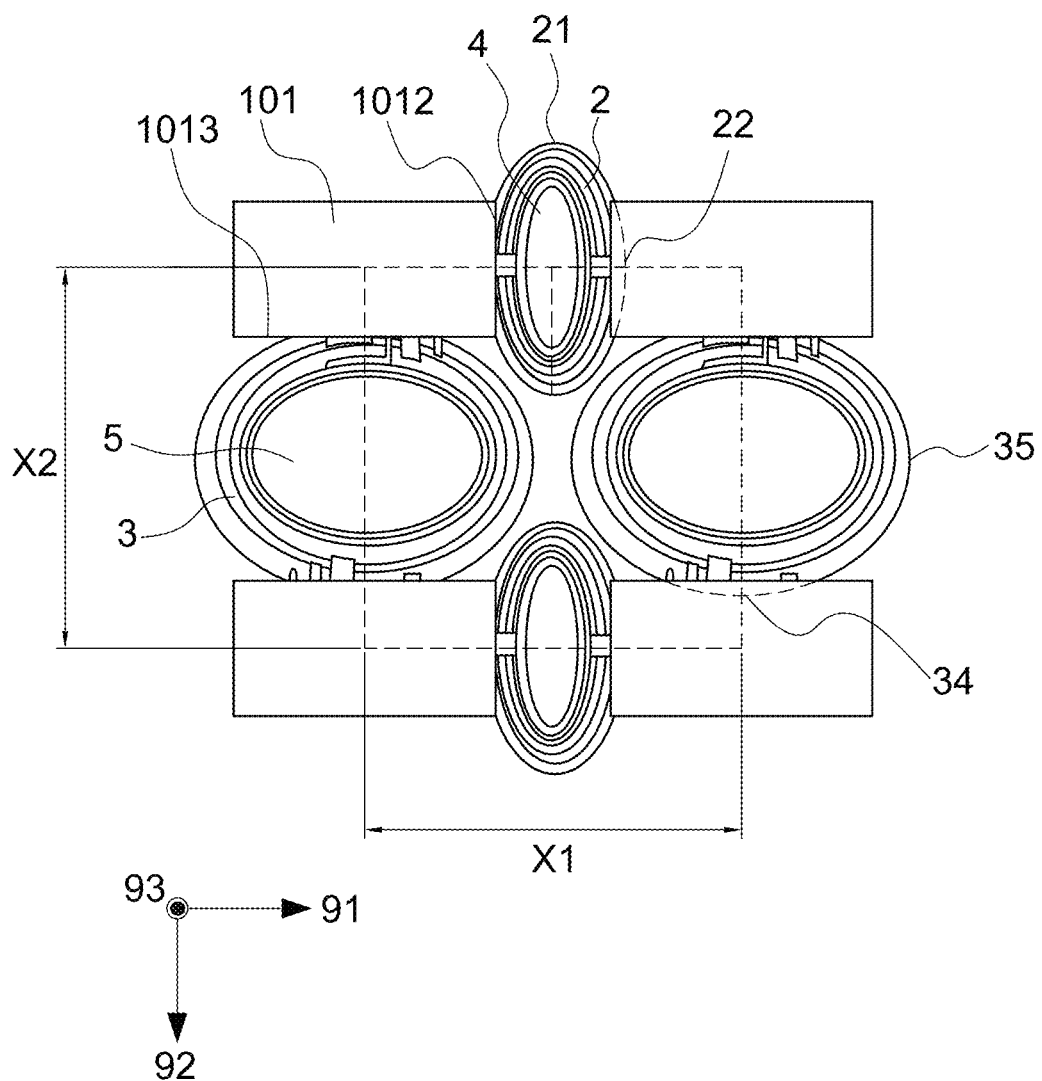
FIG. 3 is a partially enlarged schematic diagram of part B in FIG. 2 of the present invention.
Figure 4:
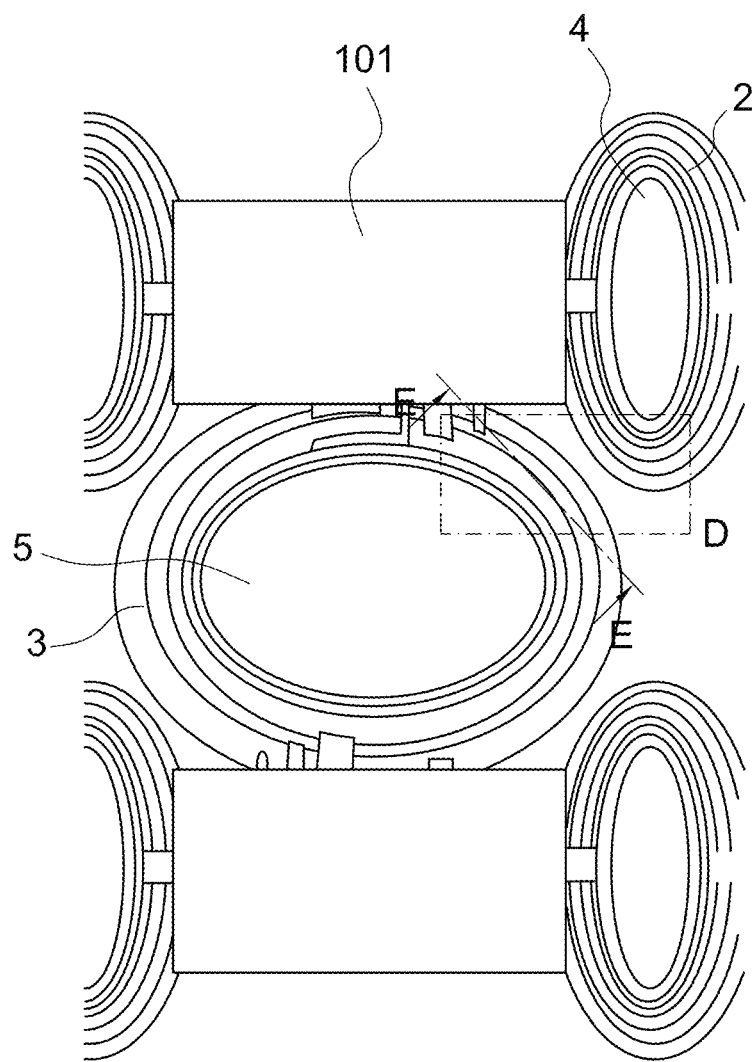
FIG. 4 is a partially enlarged schematic diagram of part C in FIG. 2 of the present invention.
Figure 5:
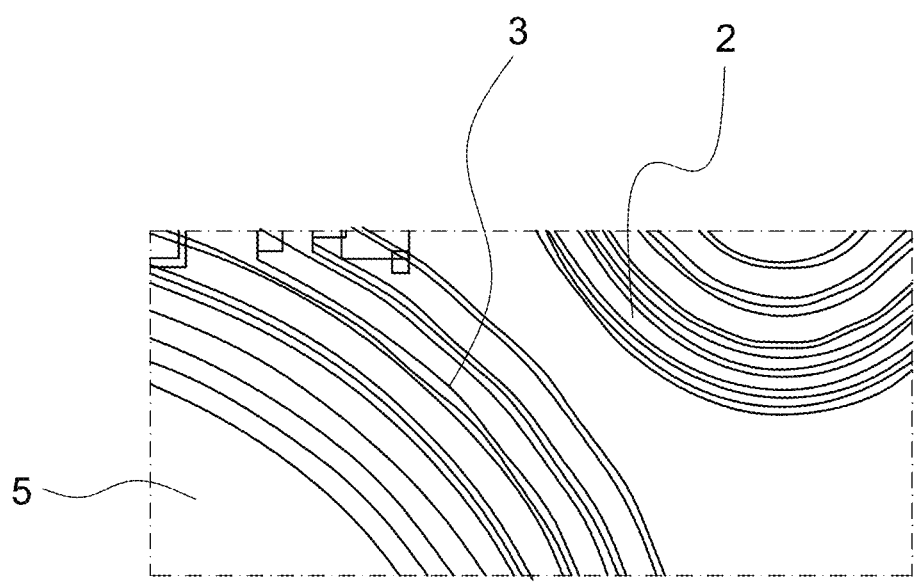
FIG. 5 is a partially enlarged schematic diagram of part D in FIG. 4 of the present invention.
Figure 6:
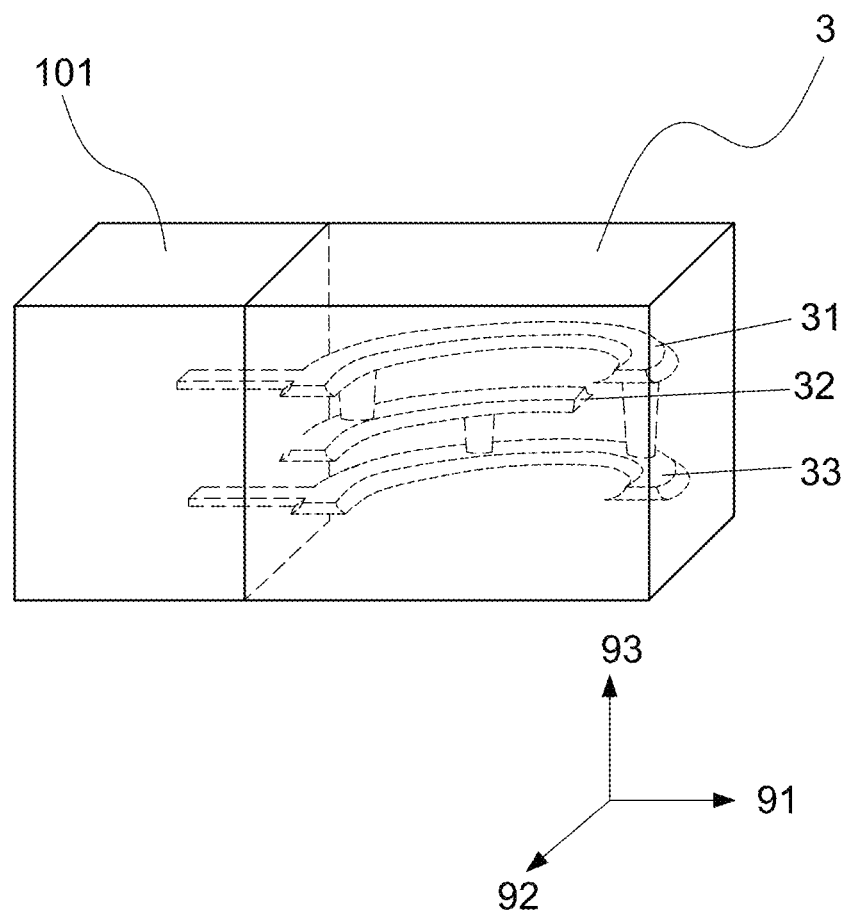
FIG. 6 is a schematic diagram of the three-dimensional structure of the section E-E in FIG. 4 of the present invention.
Figure 7:
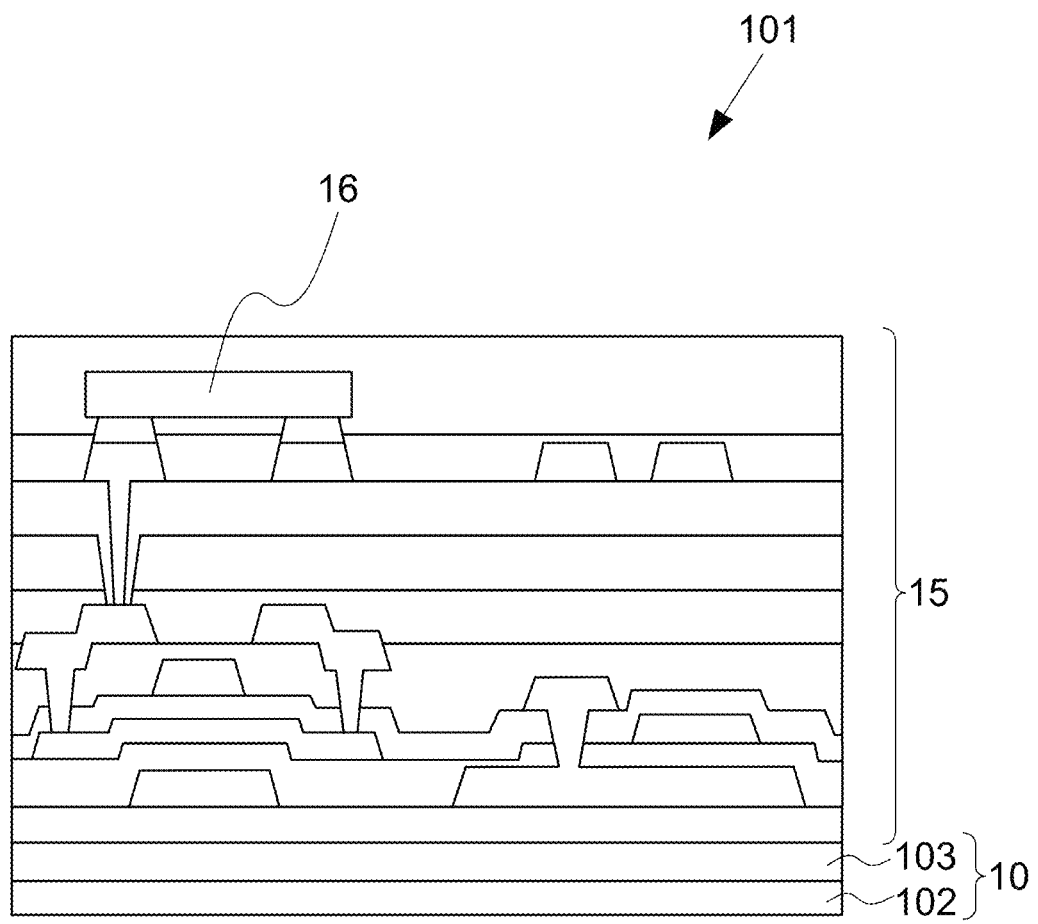
FIG. 7 is a schematic diagram of the F-F sectional structure in FIG. 2 of the present invention.
Figure 8:
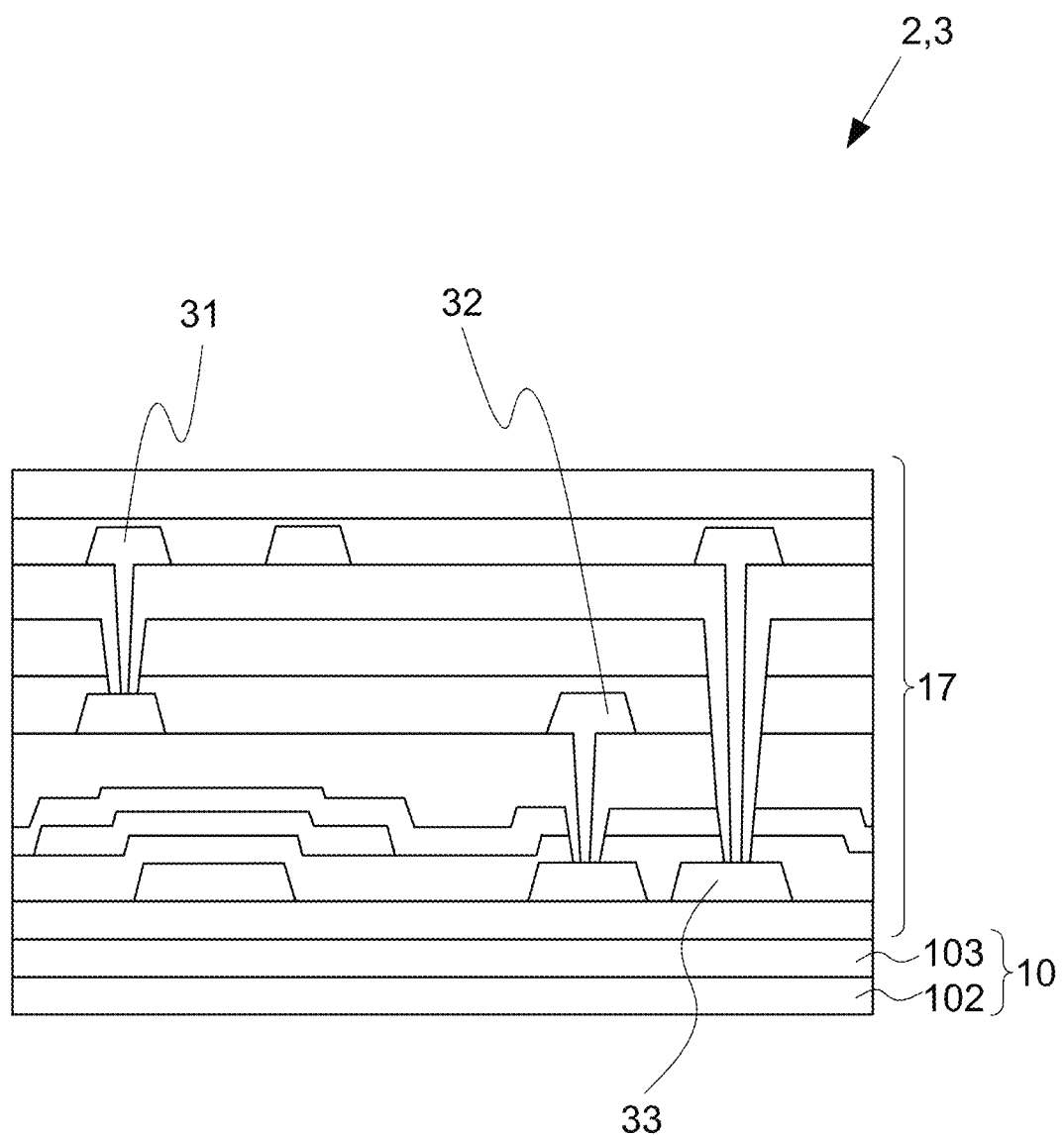
FIG. 8 is a schematic diagram of the G-G sectional structure in FIG. 2 of the present invention.
Figure 9:
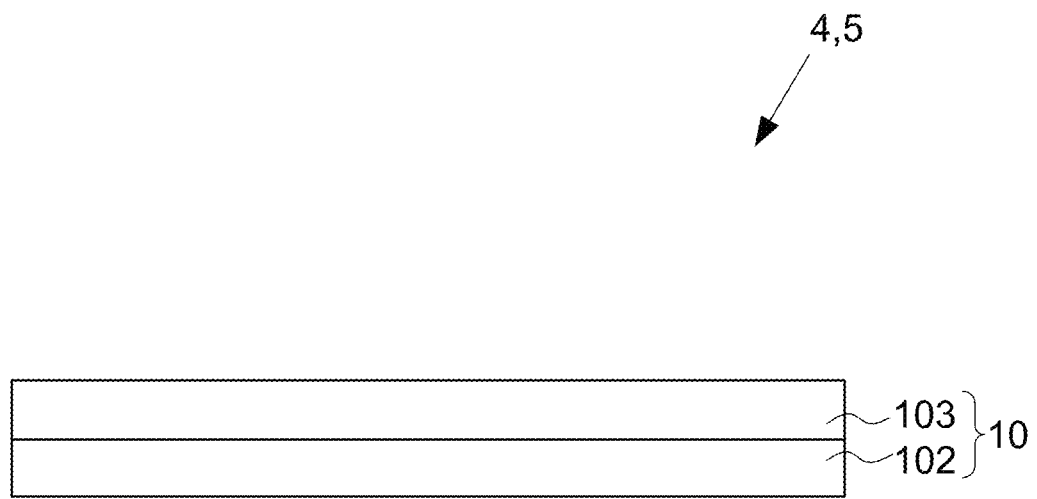
FIG. 9 is a schematic diagram of the first embodiment of the H-H section structure in FIG. 2 of the present invention.
Figure 10:
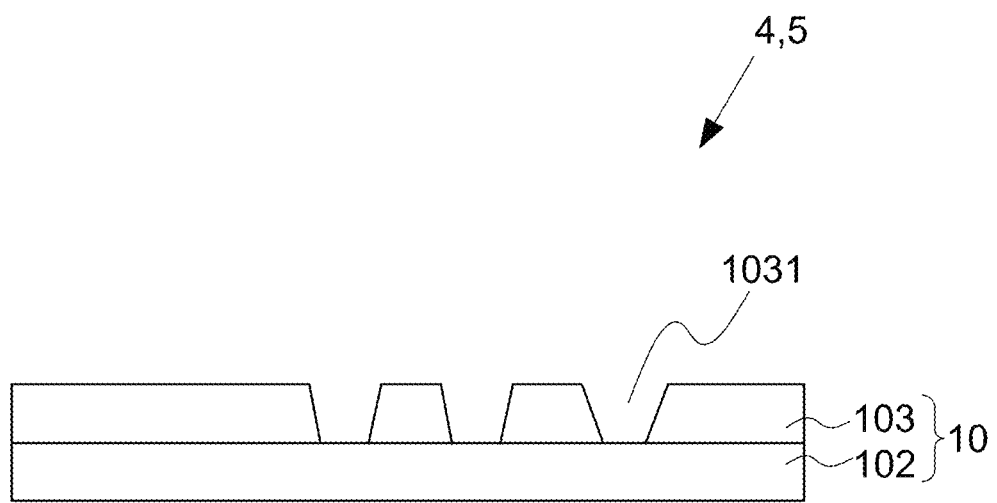
FIG. 10 is a schematic diagram of the second embodiment of the H-H section structure in FIG. 2 of the present invention.
Figure 11:
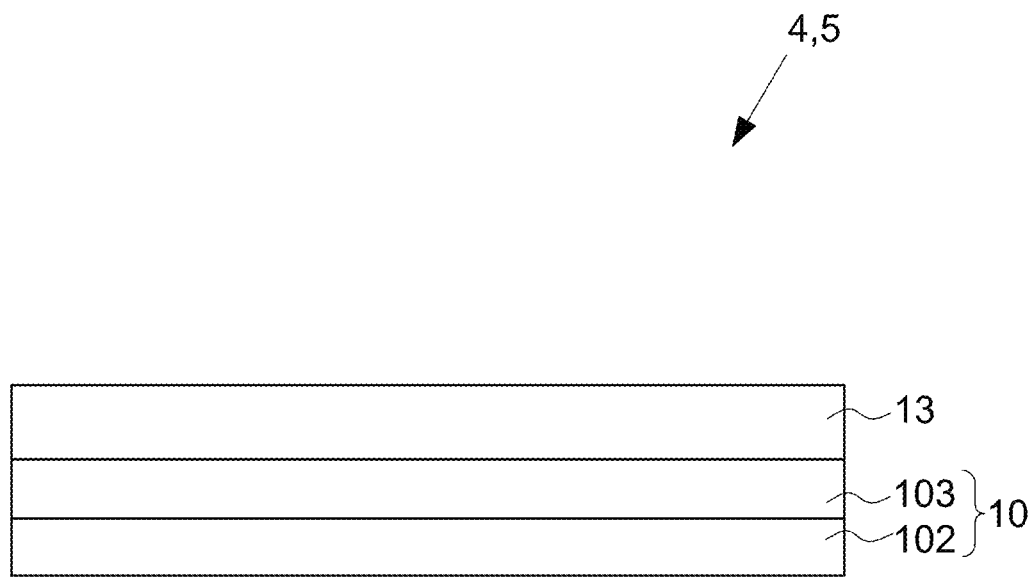
FIG. 11 is a schematic diagram of the third embodiment of the H-H section structure in FIG. 2 of the present invention.
Figure 12:
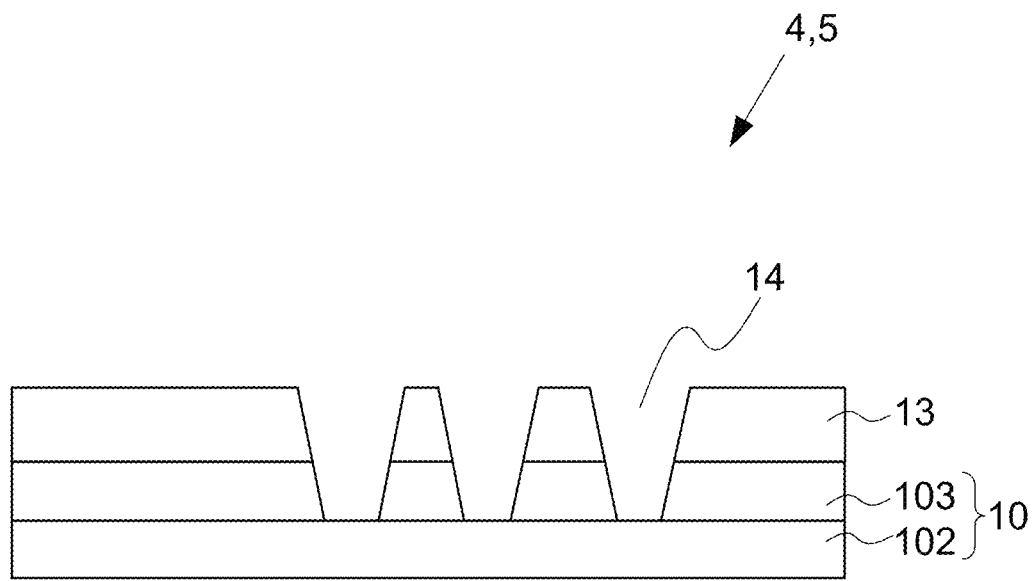
FIG. 12 is a schematic diagram of the fourth embodiment of the H-H section structure in FIG. 2 of the present invention.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows can include embodiments in which the first and second features are formed in direct contact, and can also include embodiments in which additional features are formed between the first and second features, such that the first and second features are not in direct contact. In addition, the present disclosure can repeat reference numerals and/or letters in the various examples. This repetition is for the purpose of simplicity and clarity and does not in itself dictate a relationship between the various embodiments and/or configurations discussed. It is intended that the scope of the present technology be defined by the claims appended hereto and their equivalents.

Please refer to FIG. 1 to FIG. 12, which are the front view structure of the complete panel display device of the present invention, partial enlargement of part A to part D, schematic diagrams of several embodiments of E-E sectional structure to H-H sectional structure. The complete panel display device 1 of the present invention includes a surrounding area 12 and a display area 11. The surrounding area 12 can be disposed on one side of the display area 11. The surrounding area 12 can surround the display area 11, and one or more surrounding wires and/or elements are disposed in both the display area 11 and the surrounding area 12. The complete panel display device 1 of the present invention is preferably a flexible-stretchable display device, for example capable of repeated bending along at least one bending axis. The term "bending/bending/bend" in the present invention means bending (curved/curving/curve), bending (bent/bending/bend), folding (folded/folding/fold), curling (rolled/rolling)/roll), stretching (stretched/stretching/stretch), flexing (flexed/flexing/flex), stretching (Stretchable), or other similar deformations, the above situations are generally referred to as "bending", "flexing" curved" and/or "bent".

The present invention provides a light emitting diode display device in the display area 11, it includes: a substrate 10, a plurality of first stretched signal line areas 2, a plurality of second stretched signal line areas 3, a plurality of first transparent apertures 4 and a plurality of second transparent apertures 5. The substrate 10 has a plurality of pixel element packaging areas 101 arranged in matrix, each pixel element packaging area 101 is a rectangle, and has at least one light emitting unit 16. The substrate 10 is defined a first direction 91 as extending along the long side 1013 of the pixel element packaging area 101, and defined a second direction 92 as extending along the short side 1012 of the pixel element packaging area 101, and a third direction 93 is defined which is respectively perpendicular to the first direction 91 and the second direction 92. Two centers of the pixel element packaging area 101 are separated by a first distance X1 along the first direction 91, are separated by a second distance X2 along a second direction 92. The pixel element encapsulation area 101 is designed by stacking a multilayer encapsulation structure 15 on the substrate 10, and the multilayer encapsulation structure 15 covers the light emitting unit 16.

The plurality of first stretched signal line areas 2 are arranged in matrix, has a first curve. In the embodiment of the present invention, the first curve is an ellipse. Each first stretched signal line area 2 is connected to two short sides 1012 of the pixel element packaging area 101, and is a metal signal line 31, 32, 33 made of at least one metal material connected in series with a via. The plurality of second stretched signal line areas 3 are arranged in matrix, has a second curve. In the embodiment of the present invention, the second curve is an ellipse. Each second stretched signal line area 3 is connected to two long sides 1013 of the pixel element packaging area 101, and is a metal signal line 31, 32, 33 made of at least one metal material connected in series with a via. Both the first stretched signal line area 2 and the second stretched signal line area 3 are stacked on the substrate 10 with a multilayer package structure 17, and the metal signal lines 31, 32, 33 will be packaged in the multilayer package structure 17, and the metal signal lines 31, 32, 33 are connected in series with several layers of the multilayer packaging structure 17.

The plurality of first transparent apertures 4 are arranged in matrix, each first transparent aperture 4 is surrounded by the first stretched signal line area 2, and has an aperture ratio (Y %). The plurality of second transparent apertures 5 are arranged in matrix, each second transparent aperture 5 is surrounded by the second stretched signal line area 3, and has the aperture ratio (Y %).

In an embodiment, the first transparent aperture 4 and the second transparent 5 are stacked with organic materials on the substrate 10, and the inorganic material is removed. The substrate 10 is stacked with a support substrate 102 and a flexible substrate 103. In an embodiment, the flexible substrate 103 further has a plurality of openings 1031 on the support substrate 102. The opening 1031 is tapered, and the surface area of the opening 1031 near to the flexible substrate 103 is larger than the surface area of the opening 1031 near to the supporting substrate 102. In an embodiment, the flexible substrate 103 further has a packaging layer 13. In an embodiment, the packaging layer 13 and the flexible substrate 102 further have a plurality of through holes 14 on the support substrate 102. The through hole 14 is tapered, and the surface area near to the encapsulation layer 13 is larger than the surface area near to the supporting substrate 102.

The first transparent aperture 4 and the second transparent 5 are stacked with organic materials, and because of the removal of inorganic materials, the penetration loss caused by light passing through multiple layers of refraction is reduced, so that transparent apertures form high light transmission and stretchable. The first transparent aperture 4 and the second transparent 5 are removed components for display or telecommunication transmission, can greatly reduce the problems of broken wires of display components, so as to improve the effect of stretching and using the product. In the present invention, a single transmission is connected in series with the first stretched signal line area 2 and the second stretched signal line area 3 to avoid the situation that only a single line is broken due to stretching.

In the present invention, the first stretched signal line area 2 and the second stretched signal line area 3 of multiple layers are connected in series by a signal transmission, so as to avoid the situation that only a single line is broken due to stretching. The present invention is defined a curvature design value $r=(X1*X2*Y \%/\pi)^{0.5}$, where X1 is the first distance, X2 is the second distance, Y % is the aperture ratio, and x is the circumference ratio. The first stretched signal line area 2 has two first arc curves 21 and two second arc curves 22, and the second arc curve 22 is near to the short side 1012 of the pixel element packaging area 101, the second stretched signal line area 3 has two third arc curves 34 and two fourth arc curves 35, the third arc curve 34 is near to the long side 1013 of the pixel element packaging area 101, a radius of curvature of the first arc curve 21, the second arc curve 22, the third arc curve 23 and the fourth arc curve 24 are all between 0.5 times the curvature design value r and 5 times the curvature design value r.

Figure 13:
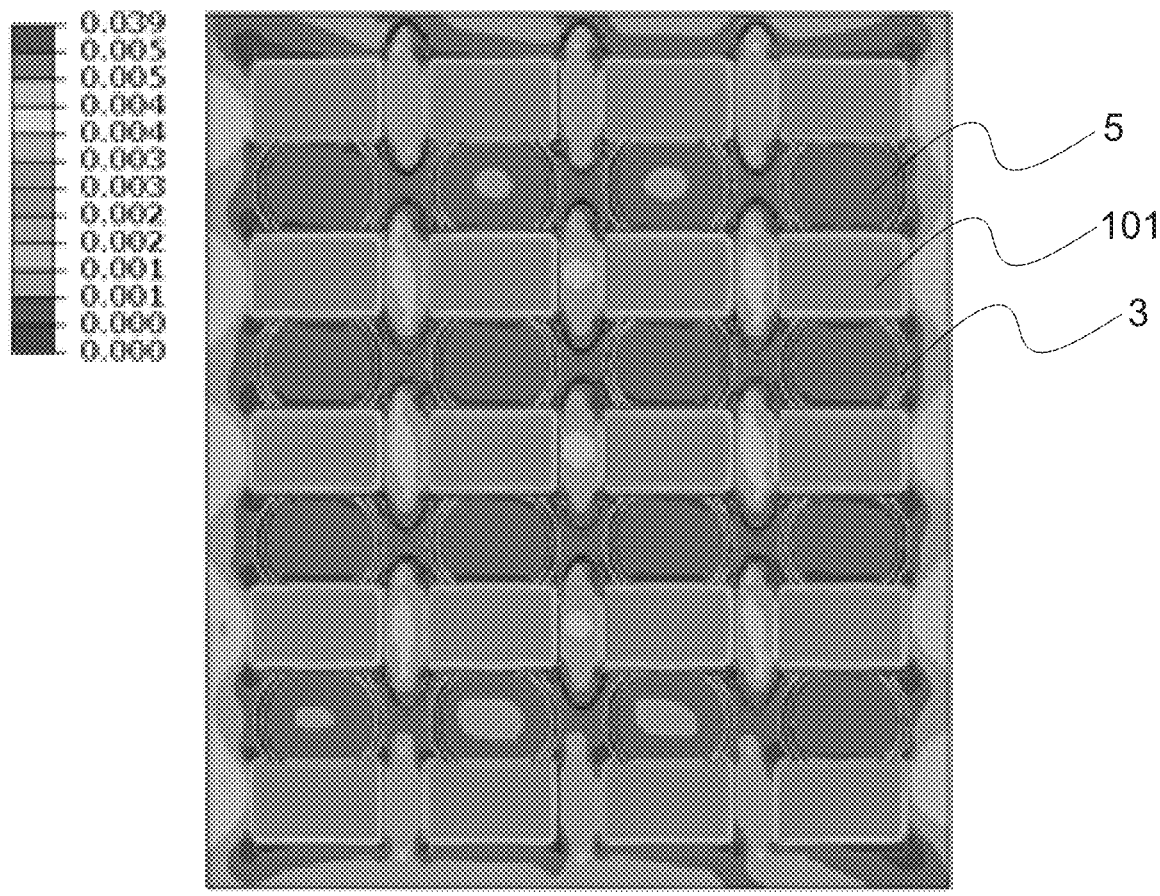
FIG. 13 is a simulated display result of a tensile test performed on the light emitting diode display device of the present invention.
Figure 14:
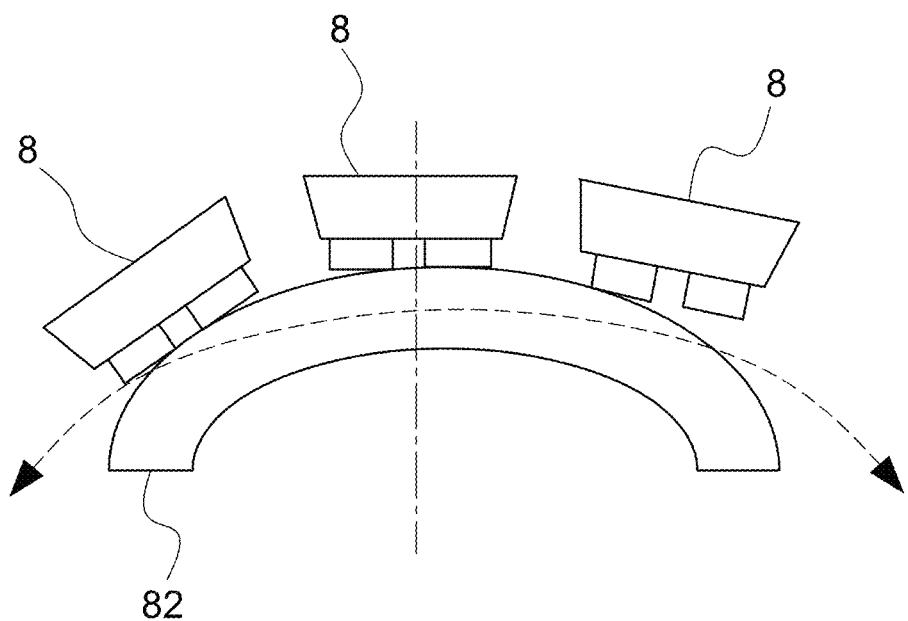
FIG. 14 is a schematic diagram of the LEDs in the prior art deviated from the neutral plane on the substrate.

Please refer to FIG. 13, which is a simulated display result of a tensile test performed on the light emitting diode display device of the present invention. The pixel element packaging area 101 has a first Young's modulus, the first stretched signal line area 2 and the second stretched signal line area 3 have the same second Young's modulus, and the first transparent aperture 4 and the second transparent aperture 5 have the same third Young's modulus, the first Young's modulus is more than the second Young's modulus, and the second Young's modulus is more than the third Young's modulus. With this design, it needs to go through a stretching process during use or manufacturing process, because the tensile strength is the product of equivalent modulus and thickness (T=E*h). Due to thickness variation or shape variation, the stress distribution of the cross-section after stress is no longer kept uniform, and when the structure is stressed and stretched, the stress will concentrate on the position with weaker tensile strength.

As shown in the results in the figure, the main stretching position of the present invention is on the second transparent aperture 5, and secondly on the pixel element packaging area 101 and the second stretching signal line area 3. The pixel element packaging area 101 is the area with the largest structural Young's modulus in the product because the multilayer encapsulation structure 15 is not easy to be stretched during the stretching process. The second transparent 5 is removed components for display or telecommunication transmission, can greatly reduce the problems of broken wires of display components, so as to improve the effect of stretching and using the product. It is important to a single transmission is connected in series with the second stretched signal line area 3 to avoid the situation that only a single line is broken due to stretching.

Unless otherwise indicated, all numbers used herein to express quantities, dimensions, and so forth used should be understood as being modified in all instances by the term "about." The use of the singular includes the plural unless specifically stated otherwise, and use of the terms "and" and "or" means "and/or" unless otherwise indicated.

From the foregoing it will be appreciated that, although specific embodiments have been described herein for purposes of illustration, various modifications can be made without deviating from the spirit and scope of the disclosure. Furthermore, where an alternative is disclosed for a particular embodiment, this alternative can also apply to other embodiments even if not specifically stated.

What is claimed is:

1. A light emitting diode display device, comprising:

A plurality of pixel element packaging areas being arranged in matrix on one side of a substrate, each pixel element packaging area being a rectangle, and having at least one light emitting unit;

A plurality of first stretched signal line areas being arranged in matrix, each first stretched signal line area being connected to two short sides of the pixel element packaging area, and having a first curve;

A plurality of second stretched signal line areas being arranged in matrix, each second stretched signal line area being connected to two long sides of the pixel element packaging area, and having a second curve;

A plurality of first transparent apertures being arranged in matrix, each first transparent aperture being surrounded by the first stretched signal line area, and having an aperture ratio;

A plurality of second transparent apertures being arranged in matrix, each second transparent aperture being surrounded by the second stretched signal line area, and having the aperture ratio.

2. The light emitting diode display device of claim 1, wherein the first transparent aperture and the second transparent are stacked with organic materials on the substrate, and the inorganic material is removed.

3. The light emitting diode display device of claim 2, wherein the substrate is stacked with a support substrate and a flexible substrate.

4. The light emitting diode display device of claim 3, wherein the flexible substrate further has a plurality of openings on the support substrate.

5. The light emitting diode display device of claim 3, wherein the flexible substrate further has a packaging layer.

6. The light emitting diode display device of claim 5, wherein the packaging layer and the flexible substrate further have a plurality of through holes on the support substrate.

7. The light emitting diode display device of claim 1, wherein the pixel element packaging area has a first Young's modulus, the first stretched signal line area and the second stretched signal line area have the same second Young's modulus, and the first transparent aperture and the second transparent aperture have the same third Young's modulus, the first Young's modulus is more than the second Young's modulus, and the second Young's modulus is more than the third Young's modulus.

8. The light emitting diode display device of claim 1, wherein the first stretched signal line area and the second stretched signal line area are made of at least one metal material, and the metal materials are connected by via.

9. The light emitting diode display device of claim 1, wherein the first curve and the second curve are elliptical.

10. The light emitting diode display device of claim 1, wherein the substrate is defined a first direction as extending along the long side of the pixel element packaging area, and defined a second direction as extending along the short side of the pixel element packaging area, two centers of the pixel element packaging area are separated by a first distance along the first direction, separated by a second distance along the second direction, and defined a curvature design value $r=(X1*X2*Y \%/\pi)^{0.5}$, where X1 is the first distance, X2 is the second distance, Y % is the aperture ratio, and is the circumference ratio.

11. The light emitting diode display device of claim 10, wherein the first stretched signal line area has two first arc curves and two second arc curves, and the second arc curve is near to the short side of the pixel element packaging area, the second stretched signal line area has two third arc curves and two fourth arc curves, the third arc curve is near to the long side of the pixel element packaging area, a radius of curvature of the first arc curve, the second arc curve, the third arc curve and the fourth arc curve are all between 0.5 times the curvature design value and 5 times the curvature design value.

12. The light emitting diode display device of claim 4, wherein the first curve and the second curve are elliptical.

13. The light emitting diode display device of claim 5, wherein the first curve and the second curve are elliptical.

14. The light emitting diode display device of claim 6, wherein the first curve and the second curve are elliptical.

15. The light emitting diode display device of claim 4, wherein the substrate is defined a first direction as extending along the long side of the pixel element packaging area, and defined a second direction as extending along the short side of the pixel element packaging area, two centers of the pixel element packaging area are separated by a first distance along the first direction, separated by a second distance along the second direction, and defined a curvature design value $r=(X1*X2*Y \%/\pi)^{0.5}$, where X1 is the first distance, X2 is the second distance, Y % is the aperture ratio, and x is the circumference ratio.

16. The light emitting diode display device of claim 5, wherein the substrate is defined a first direction as extending along the long side of the pixel element packaging area, and defined a second direction as extending along the short side of the pixel element packaging area, two centers of the pixel element packaging area are separated by a first distance along the first direction, separated by a second distance along the second direction, and defined a curvature design value $r=(X1*X2*Y \%/\pi)^{0.5}$, where X1 is the first distance, X2 is the second distance, Y % is the aperture ratio, and x is the circumference ratio.

17. The light emitting diode display device of claim 6, wherein the substrate is defined a first direction as extending along the long side of the pixel element packaging area, and defined a second direction as extending along the short side of the pixel element packaging area, two centers of the pixel element packaging area are separated by a first distance along the first direction, separated by a second distance along the second direction, and defined a curvature design value $r=(X1*X2*Y \%/\pi)^{0.5}$, where X1 is the first distance, X2 is the second distance, Y % is the aperture ratio, and x is the circumference ratio.

* * * * *